US010539631B2

(12) United States Patent
Bruna

(10) Patent No.: US 10,539,631 B2
(45) Date of Patent: Jan. 21, 2020

(54) CHARGE-CARRIER HALL-EFFECT SENSOR

(71) Applicant: Nokia Technologies Oy, Espoo (FI)

(72) Inventor: Matteo Bruna, Cambridge (GB)

(73) Assignee: Nokia Technologies Oy, Espoo (FI)

( * ) Notice: Subject to any disclaimer, the term of this patent is extended or adjusted under 35 U.S.C. 154(b) by 177 days.

(21) Appl. No.: 15/751,130

(22) PCT Filed: Jul. 19, 2016

(86) PCT No.: PCT/FI2016/050532
§ 371 (c)(1),
(2) Date: Feb. 7, 2018

(87) PCT Pub. No.: WO2017/025659
PCT Pub. Date: Feb. 16, 2017

(65) Prior Publication Data
US 2018/0231620 A1 Aug. 16, 2018

(30) Foreign Application Priority Data
Aug. 12, 2015 (EP) .................................... 15180835

(51) Int. Cl.
*G01R 33/07* (2006.01)
*H01L 43/06* (2006.01)
(Continued)

(52) U.S. Cl.
CPC .............. *G01R 33/07* (2013.01); *G01R 33/06* (2013.01); *G01R 33/1284* (2013.01);
(Continued)

(58) Field of Classification Search
CPC ........ G01R 33/00; G01R 33/02; G01R 33/06; G01R 33/07; G01R 33/12; G01R 33/1284;
(Continued)

(56) References Cited

U.S. PATENT DOCUMENTS 5,895,871 A 4/1999 Patton et al.
7,535,228 B2 5/2009 Tiernan et al.
(Continued)

FOREIGN PATENT DOCUMENTS

IN 2362/CHE/2011 7/2011
WO 2009/114689 A1 9/2009
WO 2014/060781 C2 4/2014

OTHER PUBLICATIONS

Guy et al., "Graphene Nano-Biosensors for Detection of Cancer Risk", Materials Science Forum, vol. 711, 2012, pp. 246.252.
(Continued)

*Primary Examiner* — Hoai-An D. Nguyen
(74) *Attorney, Agent, or Firm* — Nokia Technologies Oy

(57) ABSTRACT

A charge-carrier Hall-effect sensor comprising: a semiconductor or a semimetal layer; a pair of electric current contacts in electrical contact with the semiconductor or semimetal layer and separated in a first longitudinal direction along a first electric current channel; a pair of voltage contacts in electrical contact with the semiconductor or semimetal layer and separated in a second transverse direction, orthogonal to the first direction, and positioned on either side of the electric current channel; an electrically insulating layer underlying the semiconductor or the semimetal layer; and a ferromagnetic layer underlying the electrically insulating layer comprising at least one region having a magnetic moment with a component perpendicular to a plane comprising the pair of electric current contacts and the pair of voltage contacts.

18 Claims, 1 Drawing Sheet

(51) Int. Cl.
  H01L 43/10    (2006.01)
  G01R 33/06    (2006.01)
  G01R 33/12    (2006.01)
  H01L 43/04    (2006.01)
  H01L 43/14    (2006.01)
  G01R 33/09    (2006.01)
  G01R 15/20    (2006.01)

(52) U.S. Cl.
  CPC ............ *H01L 43/04* (2013.01); *H01L 43/065* (2013.01); *H01L 43/10* (2013.01); *H01L 43/14* (2013.01); *G01R 15/202* (2013.01); *G01R 33/09* (2013.01)

(58) Field of Classification Search
  CPC ........ G01R 15/00; G01R 15/14; G01R 15/20; G01R 15/202; G01R 15/207; G01R 33/09; H01L 43/00; H01L 43/02; H01L 43/04; H01L 43/06; H01L 43/065; H01L 43/10; H01L 43/12; H01L 43/14
  USPC ........................................ 324/200, 244, 252
  See application file for complete search history.

(56) References Cited

U.S. PATENT DOCUMENTS

| | | | |
|---|---|---|---|
| 7,824,340 B2 | 11/2010 | Lee et al. | |
| 2002/0062076 A1 | 5/2002 | Kandori et al. | |
| 2004/0085065 A1 | 5/2004 | Johnson et al. | |
| 2007/0096228 A1* | 5/2007 | Ahn ........................ | B82Y 25/00 257/421 |
| 2009/0203988 A1 | 8/2009 | Phua et al. | |
| 2010/0195381 A1 | 8/2010 | Karg et al. | |
| 2011/0062956 A1* | 3/2011 | Edelstein ........... | G01R 33/0286 324/251 |
| 2011/0175605 A1* | 7/2011 | Kim ........................ | G01R 33/06 324/251 |
| 2012/0063033 A1 | 3/2012 | Gurney et al. | |
| 2012/0326911 A1 | 12/2012 | Niwa et al. | |
| 2013/0245486 A1 | 9/2013 | Simon et al. | |
| 2014/0008616 A1 | 1/2014 | Geim et al. | |
| 2014/0210461 A1* | 7/2014 | Ausserlechner ..... | G01R 33/075 324/251 |
| 2014/0299839 A1 | 10/2014 | Shepard et al. | |
| 2014/0336476 A1 | 11/2014 | Li | |
| 2014/0346579 A1 | 11/2014 | Franke | |
| 2015/0031964 A1* | 1/2015 | Bly ........................ | A61B 5/7465 600/301 |
| 2015/0081225 A1 | 3/2015 | Keady et al. | |
| 2015/0131371 A1 | 5/2015 | Suh et al. | |
| 2015/0219693 A1* | 8/2015 | Sutera .................. | G01R 15/202 324/127 |
| 2017/0077394 A1* | 3/2017 | Saida ...................... | H01L 43/10 |

OTHER PUBLICATIONS

Schedin et al., "Detection of individual gas molecules adsorbed on graphene", Nature Materials, vol. 6, Sep. 2007, 10 pages.
Bouchiat et al., "Thermomagnetically Patterned Micromagnets", Applied Physics Letters, vol. 96, 102511, 2010, 4 pages.
Dean et al., "Boron Nitride Substrates for High-Quality Graphene Electronics", Nature Nanotechnology, vol. 5, 2010, pp. 722-726.
"Product Catalog", AccuVein, Retrieved on Jan. 31, 2018, Webpage available at: http://www.accuvein.com/products/catalog/.
"VeinViewer Flex", Christie, Retrieved on Jan. 31, 2018, Webpage available at : https://www.christiemed.com/products/veinviewer-models/veinviewer-flex.
"Advanced Imaging Systems for Vascular Access", VuetekScientific, Retrieved on Jan. 31, 2018, Webpage available at :https://vuetekscientific.com/.
"Finger Vein Authentication Technology", Hitachi, Retrieved on Jan. 31, 2018, Webpage available at :http://www.hitachi.co.jp/products/it/veinid/global/introduction/fingervein.html.
"Magnetocardiography", Wikipedia, Retrieved on Jan. 31, 2018, Webpage available at :https://en.wikipedia.org/wiki/Magnetocardiography.
"Magnetoencephalography", Wikipedia, Retrieved on Jan. 31, 2018, Webpage available at :https://en.wikipedia.org/wiki/Magnetoencephalography.
"Magnetomyography", Wikipedia, Retrieved on Jan. 31, 2018, Webpage available at :https://en.wikipedia.org/wiki/Magnetomyography.
"Electrical Impedance Tomography", Wikipedia, Retrieved on Jan. 31, 2018, Webpage available at :https://en.wikipedia.org/wiki/Electrical_impedance_tomography.
Sarvas, "Basic Mathematical and Electromagnetic Concepts of the Biomagnetic Inverse Problem", Physics in Medicine & Biology, vol. 32, No. 1, 1987, pp. 11-22.
Bikson, "A Review of Hazards Associated With Exposure to Low Voltages", Low Voltage Electrocution, 2004, pp. 1-18.
Tian, "Graphene-based High Spatial Resolution Hall Sensors with Potential Application for Data Storage Media Characterisation", Thesis, 2014, pp. 1-245.
Dauber et al., "Ultra-sensitive Hall Sensors Based on Graphene Boron Nitride Heterostructures", American Physical Society, 2015.
Kamalakar et al., "Enhanced Tunnel Spin Injection Into Graphene Using Chemical Vapor Deposited Hexagonal Boron Nitride", Scientific Reports, vol. 4, No. 6146, 2014, pp. 1-8.
Wang et al., "Negligible Environmental Sensitivity of Graphene in a Hexagonal Boron Nitride/graphene/h-BN Sandwich Structure", ACS Nano, vol. 6, No. 10, Sep. 25, 2012, pp. 9314-9319.
Silvestri et al., "Micromachined Flow Sensors in Biomedical Applications", Micromachines, vol. 3, No. 2, 2012, pp. 225-243.
"The Hall Effect", College Physics, Retrieved on Jan. 31, 2018, Webpage available at :http://philschatz.com/physics-book/contents/m42377.html.
Extended European Search Report received for corresponding European Patent Application No. 15170981.3, dated Nov. 26, 2015, 10 pages.
Hong et al., "Magnetic Backprojection Imaging of the Vascular Lumen", IEEE Transactions on Biomedical Engineering, vol. 42, No. 1, Jan. 1, 1995, pp. 102-108.
Claycomb et al., "Impedance Magnetocardiography: Experiments and Modeling", Journal of Applied Physics, vol. 96, No. 12, Dec. 15, 2004, pp. 7650-7654.
Extended European Search Report received for corresponding European Patent Application No. 15180835.9, dated Jan. 29, 2016, 14 pages.
Gerbedoen et al., "AlGaN/GaN MISHEMT with hBN as Gate Dielectric", Diamond and Related Materials, vol. 18, No. 5-8, May-Aug. 2009, pp. 1039-1042.
International Search Report and Written Opinion received for corresponding Patent Cooperation Treaty Application No. PCT/FI2016/050532, dated Sep. 20, 2016, 20 pages.

\* cited by examiner

CHARGE-CARRIER HALL-EFFECT SENSOR

RELATED APPLICATION

This application was originally filed as PCT Application No. PCT/FI2016/050532 filed Jul. 19, 2016 which claims priority benefit from EP Application No. 15180835.9 filed Aug. 12, 2015.

TECHNOLOGICAL FIELD

Embodiments of the present invention relate to a charge-carrier Hall-effect sensor. In particular, they relate to an ultrasensitive charge-carrier Hall-effect sensor that is capable of sensing very small changes in a charge-carrier density in a channel region of a Hall-effect sensor.

BACKGROUND

A Hall-effect sensor may be used to measure the charge-carrier density of a material that provides an electric current channel of a Hall-effect sensor. A constant electric current is passed along the electric current channel of the material in a longitudinal direction and a voltage is measured across the channel in a transverse direction. The voltage, known as the Hall voltage, is proportional to the vector cross product of the electric current and any local magnetic field divided by the charge-carrier density.

It can be difficult to create a sensitive charge-carrier Hall-effect sensor.

In order to detect a small change in the charge-carrier density by measuring a change in the Hall voltage, a vector cross product of the magnetic field and the current needs to be sufficiently high and the charge-carrier density needs to be sufficiently low and homogeneous across the sample.

BRIEF SUMMARY

According to various, but not necessarily all, embodiments of the invention there is provided a charge-carrier Hall-effect sensor comprising: a semiconductor or a semimetal layer; a pair of electric current contacts in electrical contact with the semiconductor or semimetal layer and separated in a first longitudinal direction along a first electric current channel; at least a pair of voltage contacts in electrical contact with the semiconductor or semimetal layer and separated in a second transverse direction, orthogonal to the first direction, and positioned on either side of the electric current channel; an electrically insulating layer underlying the semiconductor or the semimetal layer; and a ferromagnetic layer underlying the electrically insulating layer comprising at least one region having a magnetic moment with a component perpendicular to a plane comprising the pair of electric current contacts and the voltage contacts.

According to various, but not necessarily all, embodiments of the invention there is provided examples as claimed in the appended claims.

BRIEF DESCRIPTION

For a better understanding of various examples that are useful for understanding the detailed description, reference will now be made by way of example only to the accompanying drawings in which.

DETAILED DESCRIPTION

Figure 1:
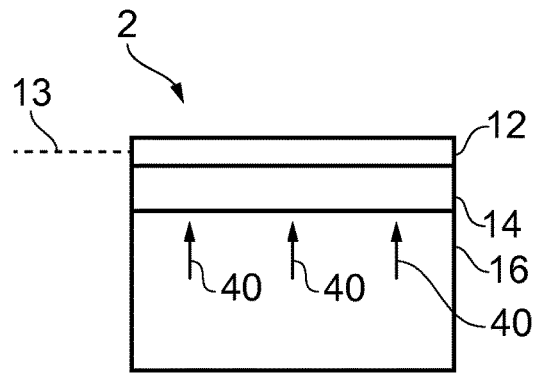
FIG. 1 illustrates an example of a sensor system comprising a charge-carrier Hall-effect sensor.

FIG. 1 illustrates a sensor system 2, which in this example comprises a charge-carrier Hall-effect sensor 10.

The charge-carrier Hall-effect sensor 10 comprises: a semiconductor or semimetal layer 12 that lies in a plane 13; an underlying electrically insulating layer 14 that lies in a plane parallel to the semiconductor/semimetal plane 13; and a ferromagnetic layer 16 underlying the electrically insulating layer 14 that also lies in a plane parallel to the semiconductor/semimetal plane 13.

In this example but not necessarily all examples, the semiconductor or the semimetal layer 12 is a flat layer lying in the plane 13.

In this example but not necessarily all examples, the semiconductor or the semimetal layer 12 is a thin layer being less than 3 nm thick and in some examples it may be less than 1 nm thick. The semiconductor or the semimetal layer 12 may be two-dimensional It may for example comprise one to five atomic layers. In some examples, it may be an atomic monolayer.

A semiconductor or semimetal have in common that they have a low density of states at the Fermi Energy level and that electric current is caused by the transport of charge-carriers of both types, that is electrons and holes. A semiconductor is a material that has a band gap between a valence band and a conduction band of less than 4 eV. A semimetal may be considered to be a semiconductor with a zero or small negative band gap.

In some but not necessarily all examples, a electric field (a voltage) may be applied to the semiconductor/semimetal layer 12 via an insulated gate electrode to adjust the Fermi Energy level and obtain a desired charge-carrier concentration.

The dimensions of the semiconductor or semimetal layer 12 in the plane are generally in the region of 1 µm and a thickness of the semiconductor/semimetal layer 12 is generally less than 3 nm. The lateral dimensions of the semiconductor/semimetal layer 12 is therefore at least 1000 times greater than its thickness and, as such, it may be appropriate to refer to the semiconductor or semimetal layer 12 as a two dimensional layer.

The semiconductor/semimetal layer 12 may for example be formed from a layer of graphene or from a layer of graphene that has been functionalised. Other materials may also be used. For example suitable materials are transition metal dichalcogenide monolayer (TMDC) e.g monolayers of the formula Mx2, with M a transition metal atom (e.g. Mo, W, etc.) and X a chalcogen atom (e.g. S, Se, or Te.). Examples of TMDC monolayers include $MoS_2$, $WS_2$, $MoSe_2$, $WSe_2$, $TiS_2$ In some, but not necessarily all examples, the semiconductor/semimetal layer 12 may be exposed to an atmosphere. This may be useful for example if the charge-carrier Hall-effect sensor 10 is used to detect the presence of a particular analyte in the atmosphere. The adsorption or attachment of the analyte to the semiconductor/semimetal layer 12 results in donation or acceptance of at least one charge-carrier which can be detected by the charge-carrier Hall-effect sensor 10. In such circumstances, the charge-carrier Hall-effect sensor 10 may be capable of detecting the presence of a single atom or molecule of analyte.

The electrically insulating layer 14 electrically isolates the semiconductor/semimetal 12 from the ferromagnetic layer 16. It is a relatively thin layer having a thickness of less than 10 nm such that the magnetic field 40 provided by the ferromagnetic layer 16 to the semiconductor/semimetal layer 12 is not diminished by unnecessary separation of the semiconductor/semimetal layer 12 from the ferromagnetic layer 16. The electrically insulating layer 14 may be formed from a material that has a low charge homogeneity. It may for example have very low impurities. Examples of suitable materials may, for example be hexagonal Boron Nitride hBN, aluminum oxide $AL_2O_3$, hafnium oxide $HfO_2$ and silicon dioxide $SiO_2$.

The ferromagnetic layer 16 comprises at least one region having a magnetic moment that has a component perpendicular to the plane 13 in which the semiconductor or semimetal layer 12 lies. This provides a perpendicular magnetic field 40 which is experienced in the semiconductor/semimetal layer 12.

The ferromagnetic layer 16 may be formed from a perpendicular magnetic anisotropy film. The thickness of the ferromagnetic layer 16 is typically greater than the lateral dimensions of the semiconductor or semimetal layer 12.

A perpendicular magnetic anisotropy film may made be made, for example, from NdFeB or $L1_0$ phase FrPt or FePd, CoPt and CoPd. A NdFeB perpendicular magnetic anisotropy film may be made, for example, by deposition of layers of Ta (100 nm), NdFeB (1-5 μm), Ta (100 nm) on a $Si/SiO_2$ substrate at 450° C. In-situ annealing at 750° C. for 15 minutes crystallizes the hard magnetic $Nd_2Fe_{14}B$ phase. The 100 nm Ta layer is a capping layer used to prevent oxidation of the ferromagnetic layer 16.

In this example the ferromagnetic layer is 3 μm thick although other thicknesses are possible. It will therefore be appreciated that the ferromagnetic layer is more than 300 times thicker than the electrically insulating layer (10 nm) and over 1000 times thicker than the semiconductor/semimetal layer 12 (<3 nm), in this example. The heterostructure formed by the semiconductor or semimetal layer 12 and the electrically insulating layer 14 is therefore extremely thin compared to the thickness of the ferromagnetic layer 16 and may be considered to be a two dimensional heterostructure.

The ferromagnetic layer 16 provides a large static magnetic field to the semiconductor or semimetal layer 12. For example, the ferromagnetic layer 16 may provide a magnetic field 40 in the region of or greater than 0.5T. For example, the choice of the materials, thickness and thermomagnetic patterning features for the ferromagnetic layer 16 may be used to control the magnitude of the magnetic field, which may be in the order of 0.1-1T.

Figure 2:
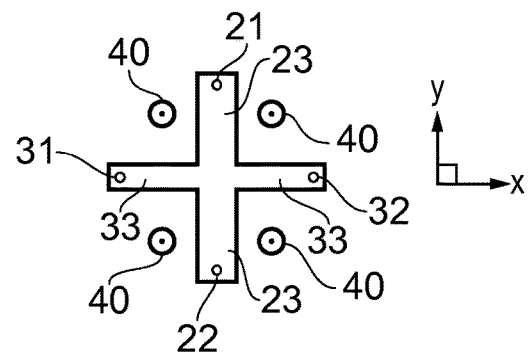
FIG. 2 illustrates a top perspective view of the charge-carrier Hall-effect sensor illustrated in FIG. 1.

FIG. 2 illustrates a top perspective view of the charge-carrier Hall-effect sensor 10 illustrated in FIG. 1. It can be seen from this fig that the semiconductor or semimetal layer 12 is a patterned layer.

The semiconductor or semimetal layer 12 has a longitudinal current channel 23 in the plane 13 along which an electric current passes and it has a transverse portion 33, orthogonal to the longitudinal electric current channel 23 and in the plane 13, across which a Hall voltage is measured.

The charge-carrier Hall-effect sensor 10 comprises a pair of electric current contacts 21, 22, in electrical contact with the semiconductor or semimetal layer 12 and separated in a first longitudinal direction (y) along the electric current channel 23 and comprises (at least) a pair of voltage contacts 31, 32 in electrical contact with the transverse portion 33 of the semiconductor or semimetal layer 12 and separated in a second transverse direction (x), orthogonal to the first longitudinal direction, and positioned on either side of the electric current channel 23.

In this example, the dimensions of the patterned semiconductor or semimetal layer 12 in the first longitudinal direction (y) and in the second transverse direction (x) are of the same order of magnitude and approximately 1 μm. It will therefore be appreciated that the longitudinal and transverse dimensions of the patterned semiconductor or semimetal layer 12 is very much greater than the thickness of the semiconductor or semimetal layer 12.

Figure 3:
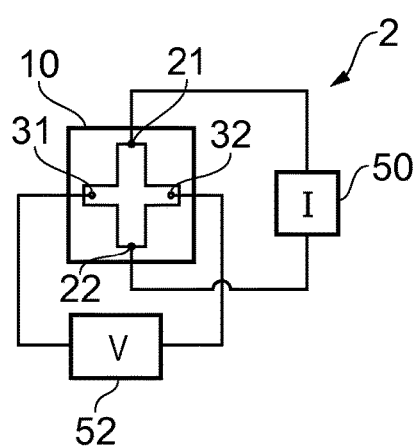
FIG. 3 illustrates an example of a sensor system comprising a charge-carrier Hall-effect sensor.

FIG. 3 illustrates an example of a sensor system 2 comprising the charge-carrier Hall-effect sensor 10 illustrated in FIG. 2. The sensor system 2 in addition to the charge-carrier Hall-effect sensor 10 additionally comprises first electrical circuitry 50 and second electrical circuitry 52. The first electrical circuitry 50 is configured to provide a constant electric current between the pair of electric current contacts 21, 22 of the charge-carrier Hall-effect sensor 10. The second electrical circuitry 52 is configured to measure a voltage and, in particular, a change in voltage between a pair of voltage contacts 31, 32 of the charge-carrier Hall-effect sensor 10.

It may be desirable for the first electric circuitry 50 to provide a constant maximum electric current that the semiconductor or semimetal layer 12 can withstand. The Hall-voltage produced between the pair of voltage contacts 31, 32 is proportional to the vector cross product of the electric current and the magnetic field. It is therefore desirable to maximize this vector cross product by maximizing the electric current, maximizing the magnetic field and maximizing the orthogonality between the electric current and the magnetic field.

The second electric circuitry 52 is sensitive enough to measure a change in Hall voltage that results in a change in the charge density of the semiconductor or semimetal layer 12. The Hall voltage is inversely proportional to the charge-carrier density. It is therefore desirable for the semiconductor or the semimetal layer 12 to have a low density of states at the Fermi level such that the charge-carrier density is not too large. In some but not necessarily all examples, a change in charge-carrier density arising from adding or removing a single charge to the material of the channel 23 is significant enough to cause a change in Hall voltage that is detectable by the second electric circuitry 52.

In the example of FIG. 2, where the channel 23 is 1 μm long in the longitudinal direction (y) and 1 μm wide in the transverse direction (x), when a current of 100 μA is applied, the second electric circuitry 52 may need to have a sensitivity of about 500 μV to detect a change caused by a single charge-carrier.

Figure 4:
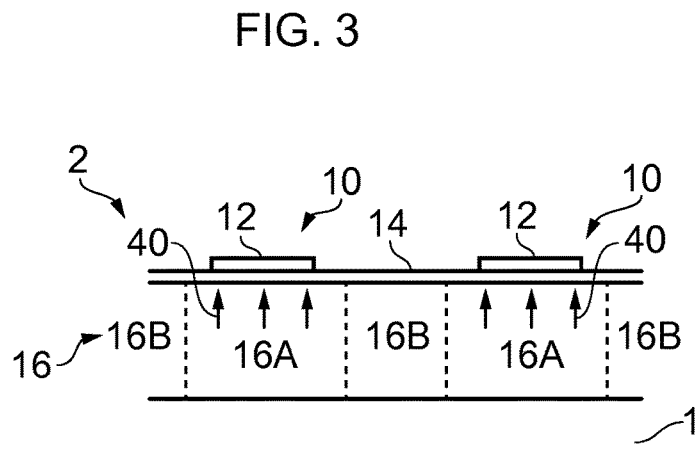
FIG. 4 illustrates an example of a sensor system comprising a charge-carrier Hall-effect sensor with a spatially variable magnetic field.

FIG. 4 illustrates another example of the sensor system 2 as illustrated in FIG. 1, 2 and/or 3, in this example, an example of the ferromagnetic layer 16 is illustrated in more detail.

Figure 5:
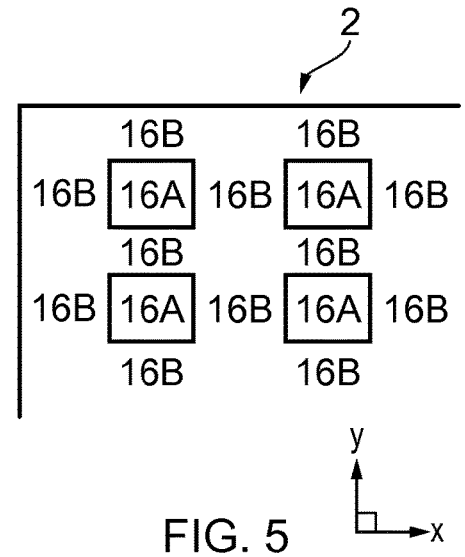
FIG. 5 illustrates an example of a top perspective view of the multi-sensor system 2 illustrated in FIG. 4.

In this example the ferromagnetic layer 16 has first regions 16A that provide a significant perpendicular magnetic field 40 and second regions 16B that do not provide the same significant perpendicular magnetic field so that there is a magnetic field contrast between the first regions 16A and the second regions 16B. For example, by using thermomagnetic patterning, the second regions 16B may, in some examples, provide a perpendicular magnetic field in the opposite direction to the perpendicular magnetic field provided by the first regions 16A. In the illustrated example each of the first regions 16A is surrounded by a second region 16B. This can be observed from FIG. 5 which is a top plan view of the multi-sensor 10 system 2 illustrated FIG. 4.

The ferromagnetic layer 16 therefore has a non-homogeneous magnetic field 40 in the transverse (x) and/or longitudinal (y) directions. The magnetic field 40 is spatially varying in the transverse (x) and/or longitudinal (y) directions.

In the first regions 16A, the magnetic domains are aligned and the maximum magnetic field 40 is obtained. These first regions 16A may be in magnetic saturation.

In the second regions 16B, the maximum magnetic field is not obtained and these regions are not in magnetic saturation in the same direction as the first regions 16A.

It can be seen from FIG. 4, that the patterned semiconductor or semimetal layer 12 associated with the single charge-carrier Hall-effect sensor 10 overlies a first region 16A and does not overlie a second region 16B. The magnetic field 40 experienced by the charge-carrier Hall-effect sensor 10 is therefore maximum.

The lateral dimensions of the first region 16A in the longitudinal and lateral directions is therefore greater than, but not significantly greater than the the lateral dimensions of the overlying semiconductor/semimetal layer 12 in the longitudinal and lateral directions. It will therefore be appreciated that a depth D of the ferromagnetic layer 16 is similar to the lateral dimensions L of the first region 16A. In some example D≥⅓*L, in other examples D≥L.

The provision of the second region 16B adjacent the first region 16A enables maximisation of the magnetic field 40 in the perpendicular direction at the first regions 16A.

In one example, the ferromagnetic layer comprising first regions 16A and second regions 16B may be formed by thermo-magnetic patterning of a perpendicular magnetic anisotropy film. Such a film may have a high magnetic coercivity and that magnetic coercivity may be temperature dependent. It is therefore possible to hold the perpendicular magnetic anisotropy film at a constant temperature and to locally heat, optionally in the presence of a magnetic field with opposite direction with respect to the magnetization of regions 16A, the perpendicular magnetic anisotropy film at the second regions 16B. The local heating causes a local elevation of temperature and causes the magnetic coercivity of the material to locally change at the second regions 16B but not the first regions.

This may result, in a reverse of the magnetic field and a degaussing of the second regions 16B but not the first regions 16A.

Alternatively, this may result, when there is local heating of the second regions 16B in the presence of the magnetic field with opposite direction with respect to the magnetization of regions 16A, in creating magnetic moments opposite to the first regions 16A in the presence of the reverse applied magnetic field that is sufficient to magnetically saturate the second regions 16A in the reverse direction at the elevated temperature but not an the un-elevated temperature. The localised heating of the second regions 16B therefore causes localised switching of the magnetic field to an opposite direction. The magnetic field 40 alternates in the longitudinal and transverse directions.

The localised heating may be achieved by using lasers with an optical resolution in the order of 1 μm, although thermal conduction may spread the heat and can reduce the resolution of the final patterned region.

In some, but not necessarily all examples, the sensor system 2 is flexible and may be mounted on a flexible substrate 18 as illustrated in FIG. 4.

The sensor system 2 may be used as a photon detector or an analyte detector.

The electrically insulating layer 14 may be formed over the ferromagnetic layer 16 using chemical vapor deposition or another suitable technique. It may, for example, be transferred as a pre-formed film. For example, a sacrificial copper foil may be heated in the presence of borazine $B_3N_3H_6$. A transfer film such as a poly(methyl methacrylate) may then be added on top of the formed boron nitride, by for example spin coating, before removing copper foil by, for example, wet etching. The transfer film and boron nitride may then be transferred onto the ferromagnetic layer 16, boron nitride side adjacent the ferromagnetic layer 16, and the transfer film removed.

The semiconductor or a semimetal layer 10 may be formed over the electrically insulating layer 14 using chemical vapor deposition or another suitable technique. It may, for example, be transferred as a pre-formed film. For example, a sacrificial copper foil may be heated in the presence of methane at about 1000° C. to form a graphene monolayer. A transfer film such as a poly(methyl methacrylate) may then be added on top of the formed graphene monolayer, by for example spin coating, before removing copper foil by, for example, wet etching. The transfer film and graphene may then be transferred onto the insulating layer 14, graphene side adjacent the electrically insulating layer 14, and the transfer film removed.

The longitudinal channel 23 and transverse portion 33 of the charge-carrier Hall sensor 10 may then be patterned and the contacts 21, 22, 31, 32 added using standard lithography techniques. Oxygen reactive ion etching may, for example, be used to pattern a graphene layer.

The thermo-magnetic patterning of the ferromagnetic layer may occur at any suitable stage during the process.

Figure 6:
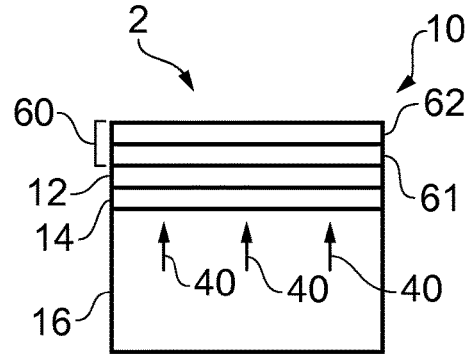
FIG. 6 illustrates another example of a charge-carrier Hall-effect sensor similar to that illustrated in FIG. 1.

FIG. 6 illustrates another example of a charge-carrier Hall-effect sensor 10 similar to that illustrated in FIG. 1 and the description above is also relevant to the charge-carrier Hall-effect sensor 10 illustrated in FIG. 6.

The charge-carrier Hall-effect sensor 10 illustrated in FIG. 6 additionally comprises an additional layer or layers 60 on top of the semiconductor or semimetal layer 12.

In some but not necessarily all examples, the additional layer(s) 60 may comprise a functionalization layer.

In some but not necessarily all examples, the additional layer(s) 60 may comprise a semi-permeable membrane in order to give selectivity to the sensor system 2. This may be useful for example if the charge-carrier Hall-effect sensor 10 is used to detect the presence of a particular analyte in the atmosphere. The additional layer(s) 60 may selectively allow that particular analyte to be transported from the atmosphere to the the semiconductor or semimetal layer 12 but not allow other potential analytes in the atmosphere to be transported from the atmosphere to the the semiconductor or semimetal layer 12.

In some but not necessarily all examples, the additional layer(s) 60 may comprise a decoupling layer 61 on top of the semiconductor or semimetal layer 12. The decoupling layer may be very thin, for example, 1 or 2 atomic layers thick. A selective layer 62 may be on top of the decoupling layer 61 (if present) to give selectivity to the sensor system 2. One example of a selective layer 62 is cross-linked poly(ethylene glycol diacrylate), which is a polymer selectively permeable to $CO_2$.

Thus the semiconductor or semimetal layer 12 may be exposed to an atmosphere directly (for example, FIG. 1) or via a selective structure (for example, FIG. 6) for detection of an analyte in the atmosphere. This may be useful for example if the charge-carrier Hall-effect sensor 10 is used to detect the presence of a particular analyte in the atmosphere. The adsorption or attachment of the analyte to the semiconductor/semimetal layer 12 results in donation or acceptance of at least one charge-carrier which can be detected by the charge-carrier Hall-effect sensor 10. In such circumstances, the charge-carrier Hall-effect sensor 10 may be capable of detecting the presence of a single atom or molecule of analyte.

The term 'comprise' is used in this document with an inclusive not an exclusive meaning. That is any reference to X comprising Y indicates that X may comprise only one Y or may comprise more than one Y. If it is intended to use 'comprise' with an exclusive meaning then it will be made clear in the context by referring to "comprising only one . . . " or by using "consisting".

In this brief description, reference has been made to various examples. The description of features or functions in relation to an example indicates that those features or functions are present in that example. The use of the term 'example' or 'for example' or 'may' in the text denotes, whether explicitly stated or not, that such features or functions are present in at least the described example, whether described as an example or not, and that they can be, but are not necessarily, present in some of or all other examples. Thus 'example', 'for example' or 'may' refers to a particular instance in a class of examples. A property of the instance can be a property of only that instance or a property of the class or a property of a sub-class of the class that includes some but not all of the instances in the class. It is therefore implicitly disclosed that a features described with reference to one example but not with reference to another example, can where possible be used in that other example but does not necessarily have to be used in that other example.

Although embodiments of the present invention have been described in the preceding paragraphs with reference to various examples, it should be appreciated that modifications to the examples given can be made without departing from the scope of the invention as claimed.

For example, there are several alternative materials that may be suitable for making the charge-carrier Hall-effect sensor 10 although these have not necessarily been experimentally verified.

The ferromagnetic layer 16 may be any magnetic thin films with perpendicular anisotropy. For example, ferromagnetic layer 16 may comprise granular hexagonal-close-packed (hcp) Co alloy, or a multilayer structure with perpendicular magnetic anisotropy like a Co/Ni, Co/Pt, Co/Pd, Fe/Pt or Fe/Pd multilayer, or a chemically-ordered binary alloy like CoPt, CoPd, FePt, FePd, CoPt3, Co3Pt, CoPd3 and Co3Pd, or a pseudo-binary alloy based on the CoPt and FePt L1O phase. The ferromagnetic layer 16 may also be an antiferromagnetic/ferromagnetic bilayer structure.

The electrically insulating layer 14 may be any insulator that can be manufactured with high quality (low density of charge traps and inhomogeneities).

The semiconductor or semimetal layer 12, may be black phosphorous.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

I claim:

1. A charge-carrier Hall-effect sensor comprising:
a semiconductor or a semimetal layer;
a pair of electric current contacts in electrical contact with the semiconductor or semimetal layer and separated in a first direction along a first electric current channel;
at least a pair of voltage contacts in electrical contact with the semiconductor or semimetal layer and separated in a second direction, orthogonal to the first direction, and positioned on either side of the first electric current channel;
an electrically insulating layer underlying the semiconductor or the semimetal layer; and
a ferromagnetic layer underlying the electrically insulating layer comprising at least one region having a magnetic moment with a component perpendicular to a plane comprising the pair of electric current contacts and the voltage contacts.

2. A charge-carrier Hall-effect sensor as claimed in claim 1, wherein the semiconductor or semimetal comprises graphene.

3. A charge-carrier Hall-effect sensor as claimed in claim 1, wherein the semiconductor or semimetal layer is:
is a flat, planar substantially two-dimensional layer comprising no more than three atomic layers; and/or
is a monolayer; and/or
consists of graphene or functionalized graphene.

4. A charge-carrier Hall-effect sensor as claimed in claim 1, wherein the semiconductor or semimetal layer is exposed to an atmosphere directly or via a selective structure for detection of an analyte in the atmosphere.

5. A charge-carrier Hall-effect sensor as claimed in claim 1, wherein the electrically insulating layer comprises hexagonal boron nitride.

6. A charge-carrier Hall-effect sensor as claimed in claim 1, wherein the ferromagnetic layer is a perpendicular magnetic isotropic film.

7. A charge-carrier Hall-effect sensor as claimed in claim 1, wherein the ferromagnetic layer has a thickness at least 300 times greater than the combined thickness of the semiconductor or semimetal layer and the electrically insulating layer and/or wherein the magnetic moment of the ferromagnetic layer provides a magnetic field of at least 0.1T.

8. A charge-carrier Hall-effect sensor as claimed in claim 1, wherein the ferromagnetic layer provides a spatially varying magnetic moment, that varies in the transverse direction and/or the longitudinal direction and/or wherein the ferromagnetic layer comprises first regions that are magnetized in a first direction, and second regions between the first regions that are magnetized in a second direction, opposite the first direction.

9. A charge-carrier Hall-effect sensor as claimed in claim 1, wherein the ferromagnetic layer has a high-magnetic coercivity that is temperature dependent, wherein the ferromagnetic layer is a thermo-magnetically patterned thermomagnetic layer comprising spatially varying magnetic domains in the transverse and longitudinal directions.

10. A charge-carrier Hall-effect sensor as claimed in claim 1, further comprising first electrical circuitry configured to provide a constant electric current between the pair of electric current contacts and second electric circuitry configured to measure a voltage change between the pair of voltage contacts, wherein the vector cross product of the electric current provided by the first electrical circuitry and the magnetic field provided by the magnetic moment of the ferromagnetic layer is sufficient to produce a change in voltage that is measurable by the second electric circuitry, when a charge-carrier density of the semiconductor or semimetal layer changes by a single charge-carrier.

11. A charge-carrier Hall-effect sensor as claimed in claim 1, mounted on a flexible substrate to provide a flexible charge-carrier Hall-effect sensor.

12. A method of manufacturing a charge-carrier Hall-effect sensor comprising:
selectively controlling magnetization of second regions of a ferromagnetic layer to provide, as magnetic islands, first regions of the ferromagnetic layer each magnetized in a first direction perpendicular to a plane occupied by the ferromagnetic layer;
providing an electrically insulating layer over the ferromagnetic layer;
providing a semiconductor or semimetal layer over the electrically insulating layer; and
patterning the semiconductor or semimetal layer to form a Hall-effect sensor overlying the first regions of the ferromagnetic layer, wherein the Hall-effect sensor comprises a pair of electric current contacts in contact with the semiconductor or semimetal layer and separated in a first longitudinal direction along a first electric current channel and a pair of voltage contacts in electrical contact with the semiconductor or semimetal layer and separated in a second transverse direction, orthogonal to the first longitudinal direction and positioned on either side of the electric current channel.

13. A method as claimed in claim 12, where in the semiconductor or semimetal comprises graphene.

14. A method as claimed in claim 12, further comprising thermo-magnetic patterning of the ferromagnetic layer to create the second regions of the ferromagnetic layer, wherein the second regions of the ferromagnetic layer are magnetized in a second direction opposite the first direction.

15. A method as claimed in claim 12, comprising maintaining a perpendicular magnetic anisotropy film at a first temperature while selectively heating the second regions of the perpendicular magnetic anisotropy film to form the second regions of the ferromagnetic layer while not heating first regions of the perpendicular magnetic anisotropy film to form first regions of the ferromagnetic layer, wherein the selective heating of the perpendicular magnetic anisotropy film causes localised degaussing.

16. A method as claimed in claim 15 wherein the selective heating is performed using lasers with an optical resolution in the order of one μm.

17. A method of detecting a single addition or subtraction to a population of charge-carriers in a charge-carrier Hall-effect sensor comprising:
a semiconductor or a semimetal layer;
a pair of electric current contacts in electrical contact with the semiconductor or semimetal layer and separated in a first longitudinal direction along a first electric current channel;
at least a pair of voltage contacts in electrical contact with the semiconductor or semimetal layer and separated in a second transverse direction, orthogonal to the first direction, and positioned on either side of the electric current channel;
an electrically insulating layer underlying the semiconductor or the semimetal layer; and
a ferromagnetic layer underlying the electrically insulating layer comprising at least one region having a magnetic moment with a component perpendicular to a plane comprising the pair of electric current contacts and the pair of voltage contacts, the method comprising:
providing a constant electric current between the pair of electric current contacts while measuring variations in the voltage between the pair of voltage contacts.

18. A method as claimed in claim 17, wherein the semiconductor or semimetal comprises graphene.

* * * * *